United States Patent
Raley et al.

(10) Patent No.: US 11,361,993 B2
(45) Date of Patent: Jun. 14, 2022

(54) METHOD FOR INVERSE VIA PATTERNING FOR BACK END OF LINE DUAL DAMASCENE STRUCTURES

(71) Applicant: Tokyo Electron Limited, Tokyo (JP)

(72) Inventors: Angelique D. Raley, Albany, NY (US); Katie Lutker-Lee, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 67 days.

(21) Appl. No.: 16/701,370

(22) Filed: Dec. 3, 2019

(65) Prior Publication Data
US 2020/0194308 A1 Jun. 18, 2020

Related U.S. Application Data

(60) Provisional application No. 62/779,600, filed on Dec. 14, 2018.

(51) Int. Cl.
*H01L 21/768* (2006.01)

(52) U.S. Cl.
CPC .. *H01L 21/76885* (2013.01); *H01L 21/76877* (2013.01)

(58) Field of Classification Search
CPC ......... H01L 21/76885; H01L 21/76877; H01L 21/76808; H01L 23/53242; H01L 21/76801
See application file for complete search history.

(56) References Cited

U.S. PATENT DOCUMENTS

| | | | |
|---|---|---|---|
| 5,953,626 A * | 9/1999 | Hause | H01L 21/7682 438/622 |
| 6,054,389 A | 4/2000 | Cheng | |
| 6,350,695 B1 | 2/2002 | Tae et al. | |
| 6,960,834 B2 * | 11/2005 | Nakamura | H01L 21/76801 257/651 |
| 9,431,292 B1 | 8/2016 | Bonilla et al. | |
| 9,553,019 B1 * | 1/2017 | Briggs | H01L 21/76829 |
| 9,613,862 B2 | 4/2017 | Lenhardt et al. | |
| 10,032,668 B2 | 7/2018 | Lenhardt et al. | |

(Continued)

OTHER PUBLICATIONS

International Search Report and Written Opinion of the International Searching Authority dated Mar. 27, 2020 in PCT/US2019/064128, citing documents AA-AM therein, 8 pages.

*Primary Examiner* — Julia Slutsker
(74) *Attorney, Agent, or Firm* — Oblon, McClelland, Maier & Neustadt, L.L.P.

(57) ABSTRACT

A process flow is utilized for patterning of dual damascene structures in BEOL process steps. Conductor vias are inversely patterned in the form of pillars that are formed before the final dielectric stack is deposited. The final dielectric stack may include a low-k dielectric and the conductor may be ruthenium. The vias may be formed by forming conductor pillars in patterned voids of a sacrificial layer. After the pillars are formed, certain areas between the pillars can then be backfilled with a dielectric, such as for example, a low-k dielectric material. The trench conductor of the dual damascene structure may then be formed. The sacrificial dielectric may then be removed and an additional layer of low-k dielectric material can then be deposited or coated on the structure to provide the final structure having the dual damascene vias and trenches filled with the conductor surrounded by low-k material.

20 Claims, 17 Drawing Sheets

(56) References Cited

U.S. PATENT DOCUMENTS

| | | | |
|---|---|---|---|
| 10,388,565 B2 | 8/2019 | Lenhardt et al. | |
| 2002/0164544 A1 | 11/2002 | Luckanc et al. | |
| 2004/0164419 A1* | 8/2004 | Ahn | H01L 23/5222 |
| | | | 257/758 |
| 2011/0049724 A1* | 3/2011 | Anderson | H01L 21/7682 |
| | | | 257/773 |
| 2017/0062275 A1 | 3/2017 | Lenhardt et al. | |
| 2017/0062331 A1 | 3/2017 | Lenhardt et al. | |
| 2017/0133268 A1 | 5/2017 | Lenhardt et al. | |
| 2018/0145035 A1* | 5/2018 | Singh | H01L 23/49827 |
| 2018/0269103 A1 | 9/2018 | Lenhardt et al. | |
| 2019/0333813 A1 | 10/2019 | Lenhardt et al. | |
| 2019/0333814 A1 | 10/2019 | Lenhardt et al. | |

* cited by examiner

METHOD FOR INVERSE VIA PATTERNING FOR BACK END OF LINE DUAL DAMASCENE STRUCTURES

This application claims priority to U.S. Provisional Patent Application No. 62/779,600, entitled, "Method for Inverse Via Patterning for Back End of Line Dual Damascene Structures" filed Dec. 14, 2018; the disclosure of which is expressly incorporated herein, in its entirety, by reference.

BACKGROUND

The present disclosure relates to the processing of substrates, such as for example, semiconductor substrates. In particular, the method provides a novel process flow for forming damascene structures.

As geometries in substrate processing continue to shrink, the technical challenges to forming structures on substrates increase as both physical and electrical specifications are becoming more demanding. One such challenge is the formation of conductors. Particularly challenging is the formation of conductors in back end of line (BEOL) processing. Performance characteristics that are particularly important in such applications include resistance-capacitance (RC) delay, power consumption, reliability and others. Many factors may impact these characteristics including the conductor utilized, the dielectric constant of dielectrics surrounding the conductor, dielectric chamfer angles, etc.

Traditional BEOL damascene techniques often include the use of copper as a conductor and low dielectric constant (low-k) dielectrics. However, increasingly copper does not provide satisfactory electrical characteristics as BEOL specifications become more demanding. Ruthenium can be a replacement conductor for copper. Etching of ruthenium is not, however, typically compatible with the use of low-k dielectrics due to damage to the dielectric caused by standard ruthenium etches, so this issue needs to be addressed.

It would be desirable to provide a substrate processing flow which provides improved damascene structures.

SUMMARY

Described herein is an innovative method to process substrates. In one example, the process flow is utilized for patterning of dual damascene structures in BEOL process steps. In one embodiment, conductor vias are inversely patterned in the form of pillars that are formed before the final dielectric stack is deposited. In one exemplary embodiment, the final dielectric stack includes a low-k dielectric. In one embodiment, the conductor is ruthenium. In another embodiment, the structure formed is a dual damascene structure. In one embodiment, the vias of the damascene structure are formed by forming conductor pillars in patterned voids of a sacrificial layer. After the pillars are formed, certain areas between the pillars can then be backfilled with a dielectric, such as for example, a flowable low-k or even ultra-low-k (ULK) material. This will form the via portion of the dual damascene structure. The trench conductor of the dual damascene structure may then be formed. The sacrificial dielectric may then be removed and an additional layer of low-k dielectric material can then be deposited or coated on the structure to provide the final structure having the dual damascene vias and trenches filled with the conductor surrounded by low-k material.

In one embodiment, a method for providing a dual damascene structure on a substrate is provided. The method may comprise providing the substrate with a patterned sacrificial layer, the patterned sacrificial layer corresponding to a trench pattern of the dual damascene structure. The method further comprises forming via conductor pillars of the dual damascene structure between the patterned sacrificial layer, the via conductor pillars formed with a first conductor layer and forming a first dielectric layer between the via conductor pillars and the patterned sacrificial layer. The method may further comprise forming trench conductors of the dual damascene structure, the trench conductors overlying the via conductor pillars and the first dielectric layer. The method may further comprise removing the patterned sacrificial layer to form void regions and forming a second dielectric layer in the void regions.

In one alternative embodiment of the method, the forming via conductor pillars comprises patterning via regions on the substrate and forming the first conductor layer in the via regions to provide the via conductor pillars.

In another alternative embodiment of the method, the forming via conductor pillars comprises forming the first conductor layer between the patterned sacrificial layer, and, after forming the first conductor layer, patterning the first conductor layer in accordance with a via pattern of the dual damascene structure to provide the via conductor pillars.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
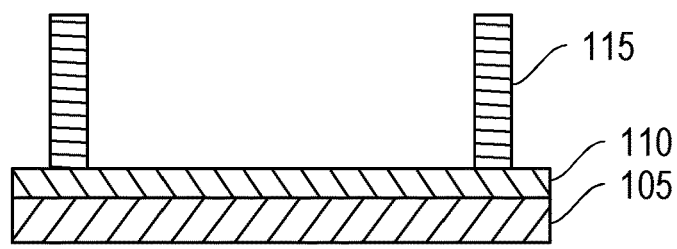
FIGS. 1A-1D illustrate an overview of one embodiment of an exemplary damascene process according to techniques disclosed herein.
Figure 1B:
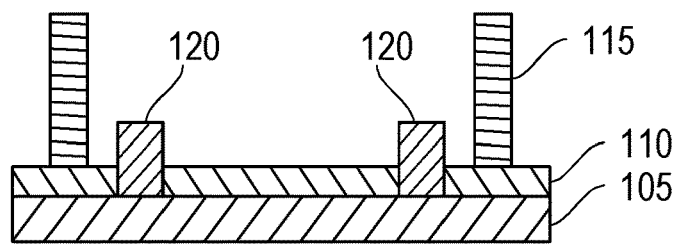

Described herein is an innovative method to process substrates. In one example, the process flow is utilized for patterning of dual damascene structures in BEOL process steps. In one embodiment, conductor vias are inversely patterned in the form of pillars that are formed before the final dielectric stack is deposited. In one exemplary embodiment, the final dielectric stack includes a low-k dielectric. In one embodiment, the conductor is ruthenium. In another embodiment, the structure formed is a dual damascene structure. In one embodiment, the vias of the damascene structure are formed by forming conductor pillars in patterned voids of a sacrificial layer. After the pillars are formed, certain areas between the pillars can then be backfilled with a dielectric, such as for example, a flowable low-k or even ultra-low-k (ULK) material. This will form the via portion of the dual damascene structure. The trench conductor of the dual damascene structure may then be formed. The sacrificial dielectric may then be removed and an additional layer of low-k dielectric material can then be deposited or coated on the structure to provide the final structure having the dual damascene vias and trenches filled with the conductor surrounded by low-k material.

Through the use of a patterned sacrificial layer to assist in forming the vias and trenches, the process may de-couple the impact that the conductor etch processes have on the low-k dielectric layer as the low-k dielectric layer need not be subjected to the conductor etch. Further, the patterned sacrificial layer may ultimately be removed and thus is not required to be formed of materials that have low-k properties. Thus, non low-k oxides, nitrides, etc. may be utilized for the sacrificial layer. The material chosen for the sacrificial layer may provide more process margin and robustness for exposure to any conductor etch or planarization steps. Thus, for example, a ruthenium conductor may be utilized. Further, as the final low-k dielectric is not exposed to the conductor etch chemistry and process, damage to the low-k dielectric by such chemistries and processes is avoided.

Exemplary process flows utilizing the techniques described herein are described with relation to FIGS. 1A-1D, 2A-8C and 9A-16C. As shown in these process flows, a dual damascene process is illustrated to provide connection to an underlying metal layer. It will be recognized that the techniques described herein may also be utilized in other process flows and are not limited to dual damascene applications. Further, though shown with regard to an underlying metal layer, other underlying conductors may be utilized. Further it will be recognized that all of the layers shown may be part of a substrate that may be any substrate for which the use of patterned features is desirable. For example, in one embodiment, the substrate may be a semiconductor substrate having one or more semiconductor processing layers formed thereon. In one embodiment, the substrate may be a semiconductor wafer that has been subject to multiple semiconductor processing steps which yield a wide variety of structures and layers, all of which are known in the substrate processing art and may be considered to be part of the substrate. In one embodiment, the concepts disclosed herein may be particularly advantageous for use at a BEOL processing step. However, in other embodiments, the concepts disclosed herein may be utilized at a front end of line (FEOL) or middle of line (MOL) process step. In another embodiment, the underlying layers may be patterned in such a way to allow for self-alignment through methods including but not limited to metal recess, selective deposition, or block lithography FIGS. 1A-1D illustrate at a high level one embodiment of the concepts described herein. FIGS. 2A-8C illustrate in more detail an exemplary direct fill embodiment of the concepts described herein. FIGS. 9A-16C illustrate in more detail an exemplary direct etch embodiment of the concepts described herein.

It will be recognized by those skilled in the art that, in the figures, the various layers and the materials which form those layers are exemplary and other equivalent layers and materials may be utilized. Further, it will be recognized that some of the various layers are not necessary to obtain the advantages of the techniques described herein and/or additional layers may be utilized. As shown in the figures, an underlying conductor layer (for example metal) is provided. It will be recognized that, although not shown, additional layers of the substrate may exist. Above the underlying conductor layer, a barrier low-k (BLOK) layer may be utilized as is known in the art. Such a use of a BLOK layer is merely exemplary and not required in all embodiments. A wide range of BLOK materials are known, such as nitrogen doped carbide (NDC), a nitrogen doped low-k barrier layer (NBlok) or other low-k barrier materials. Additional barrier layers may also include ceramics including but not limited to, aluminum oxide, aluminum nitride, aluminum oxy-nitride. Above the Blok layer and/or underlying conductor, a patterned sacrificial layer is provided. The pattern of the sacrificial layer may conform to the desired trench pattern. The patterning of the sacrificial layer may be accomplished in any number of manners all as would be known in the art. In one embodiment, photolithography techniques are used for the patterning. However, the process techniques described herein are not limited to a particular patterning technique. The material of the sacrificial layer may be a dielectric material, including oxides, nitrides and a wide range of other dielectrics. Further, as the sacrificial layer will ultimately be removed, other materials may be utilized as the concepts described herein are not limited to a particular sacrificial material.

The examples shown utilize ruthenium as a conductor. Again it will be recognized that the process flow described herein may be utilized with other conductor materials. Further, the conductor material may be formed by any of a variety of processes including standard depositions or bottom up formation processes, as the techniques described herein are not limited to a particular conductor formation process. The examples shown also utilized a low-k dielectric for the damascene structure. The low-k dielectric may be any of a wide range of low-k materials known in the art and may be formed by flowable processes, spin-on processes, selective growth, etc. It will be recognized that low-k dielectrics are particularly advantages for use in BEOL applications, however the process flow described herein is not necessarily limited to use of low-k dielectrics. Finally, the process flows shown herein include various etch and/or planarization steps and it will be recognized that the etch and/or planarization steps may be any of a wide range of known etch and/or planarization steps.

Figure 1C:
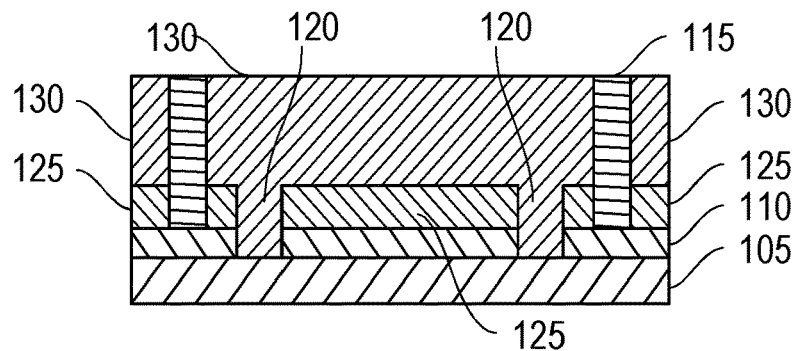
Figure 1D:
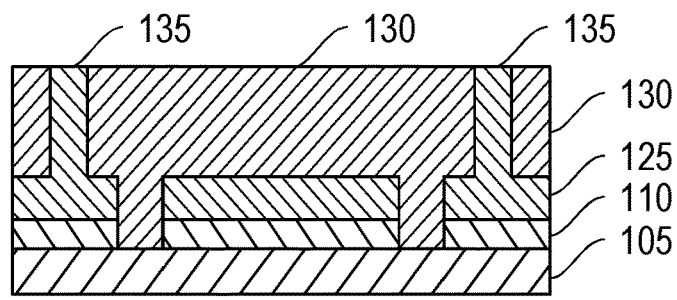

As shown in FIGS. 1A-1D, one embodiment is disclosed at a high level for using via conductors that are inversely patterned in the form of pillars that are formed before the final dielectric stack is deposited. The first step of FIG. 1A illustrates the underlying conductor layer 105 (for example a metal layer), Blok layer 110 and patterned sacrificial layer 115. As shown in FIGS. 1A-1D, the sacrificial layer pattern conforms to the desired trench dielectric pattern. At the second step, FIG. 1B, vias have been patterned in the Blok layer 110 and ruthenium pillars 120 are formed so that a first conductor layer contacts the underlying conductor layer 105. As shown in the third step, FIG. 1C, an ultra low-k dielectric layer 125 has filled between the ruthenium pillars 120 and the patterned sacrificial layer 115. As can be seen in FIG. 1C, the patterned sacrificial layer 115 extends above a height of the ultra low-k dielectric layer 125. Then, ruthenium layer 130 has been filled in the trench regions to form the structure shown in FIG. 1C. Finally, as shown in FIG. 1D, the patterned sacrificial layer 115 has been removed and filled with additional ultra low-k dielectric 135. In this manner, conductor vias are inversely patterned in the form of pillars that are formed before the final dielectric stack is deposited. The dual damascene structure has the vias formed by providing conductor pillars in patterned gaps of a sacrificial layer. After the pillars are formed, certain areas between the pillars can then be backfilled with the low-k dielectric. This will complete formation of the via portion of the dual damascene structure. The trench conductor of the dual damascene structure may then be formed. The sacrificial dielectric may then be removed and an additional layer of low-k dielectric material can then be deposited FIGS. 2A-8C illustrate in more detail a direct fill embodiment of the concepts described herein. In the figures, the process steps are shown in three views of the substrate: a top down view, a first cross-section B-B (the top to bottom cross section of the top down view), and a second cross-section C-C (the left to right cross section of the top down view). Each FIG. 2A, 3A, 4A . . . 8A illustrates the top down view, each FIG. 2B, 3B, 4B . . . 8B illustrates the corresponding cross section B-B, and each FIG. 2C, 3C, 4C . . . 8C illustrates the corresponding cross section C-C.

Figure 2A:
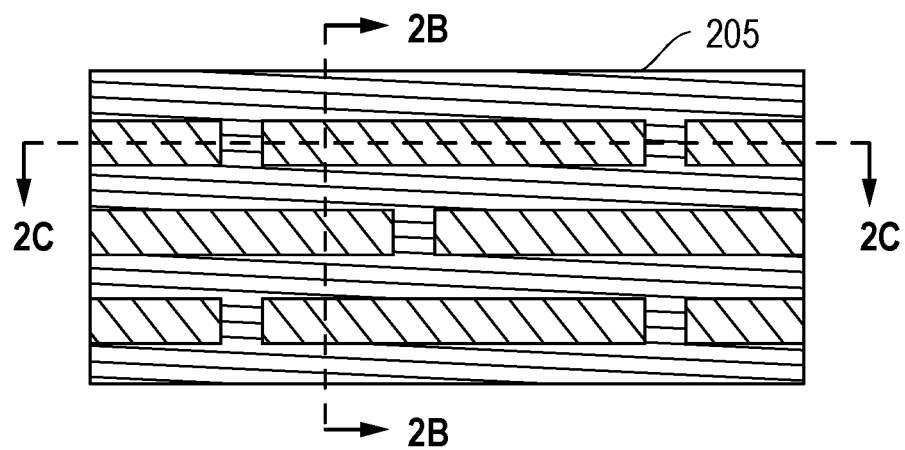
FIGS. 2A-8C illustrate a direct fill embodiment of an exemplary damascene process according to techniques disclosed herein.
Figure 2B:
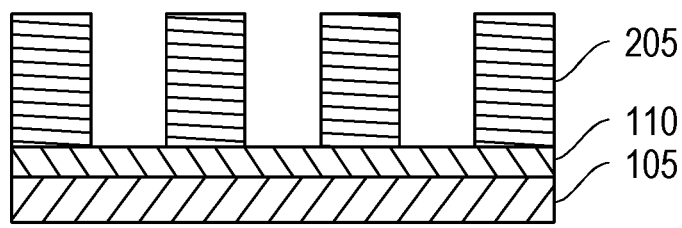
Figure 2C:
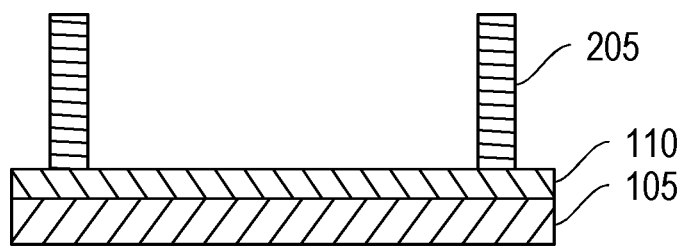
Figure 3A:
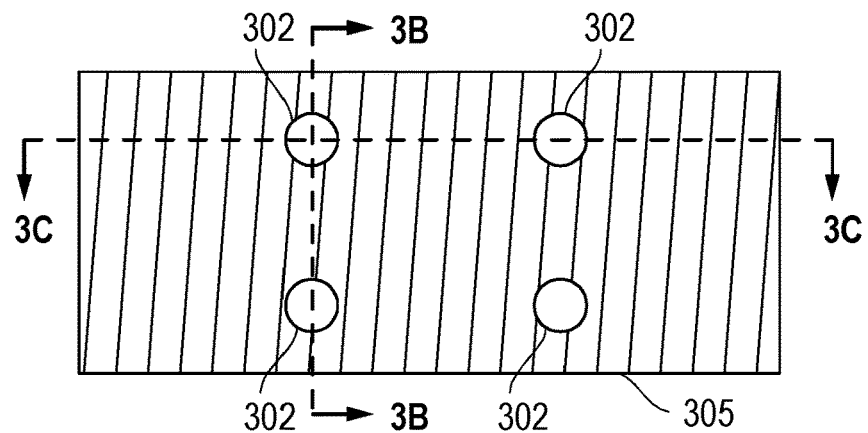
Figure 3B:
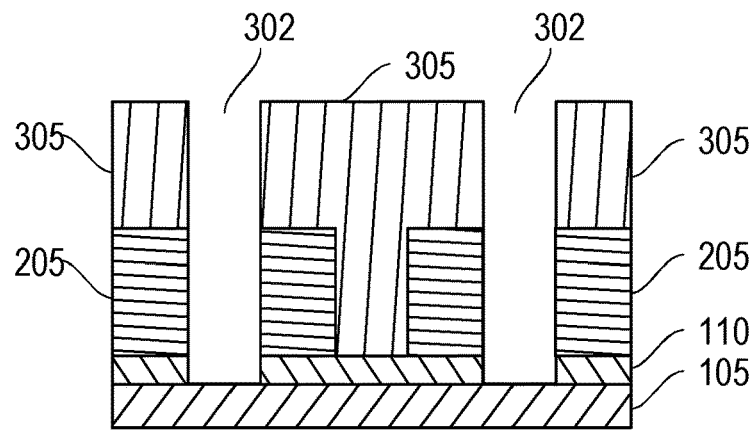
Figure 3C:
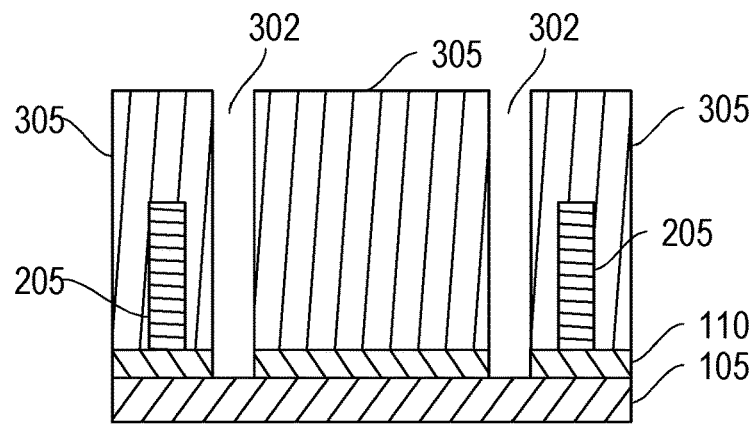
Figure 4A:
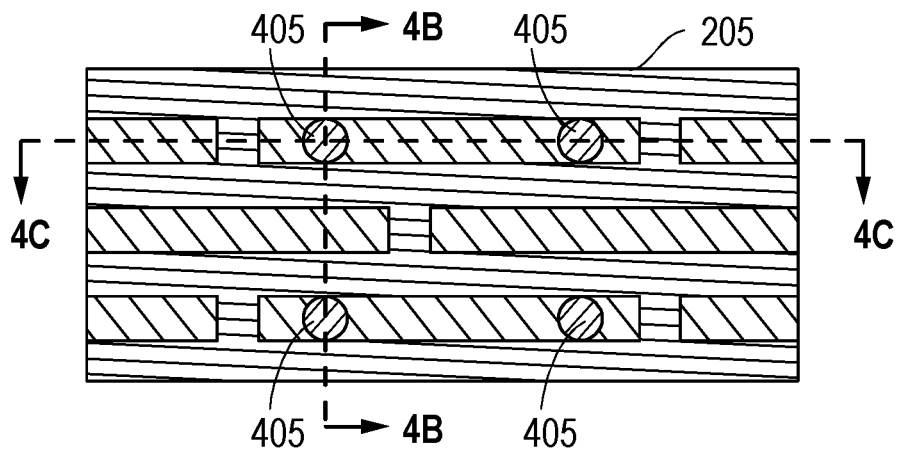
Figure 4B:
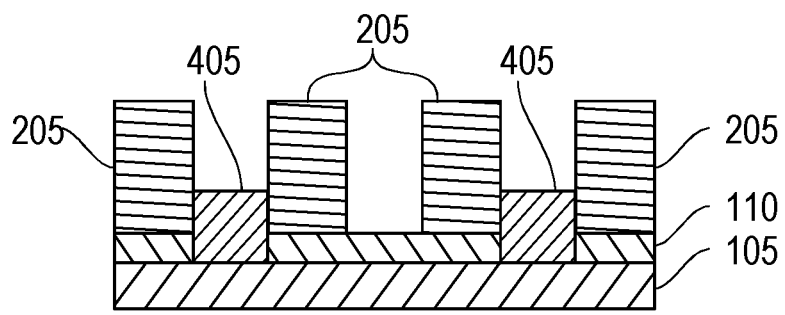
Figure 4C:
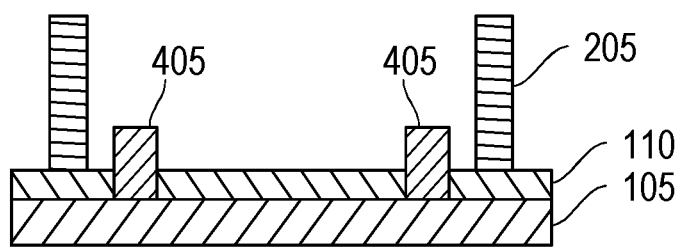

At the first step, FIG. 2A-2C, a sacrificial layer 205 is patterned to conform to the ultimate desired the trench patterns. In one exemplary embodiment, the sacrificial layer 205 is a dielectric such as tetraethyl orthosilicate (TEOS)). A Blok layer 110 and the underlying conductor layer 105 are provided similar to that as described in FIG. 1A. Next, a planarization layer 305 is provided over the substrate with a pattern that corresponds to the via pattern (e.g. via 302) as shown in FIGS. 3A-3C. In one exemplary embodiment, the planarization layer 305 is an organic planarization layer. The planarization layer 305 is patterned and etched as shown in FIGS. 3A-3C with at least a portion of the Blok layer also being etched as shown. Then as shown in FIGS. 4A-4C, ruthenium conductor pillars 405 are filled in the via regions (e.g. via 302) and then the planarization layer 305 is removed as shown.

Figure 5A:
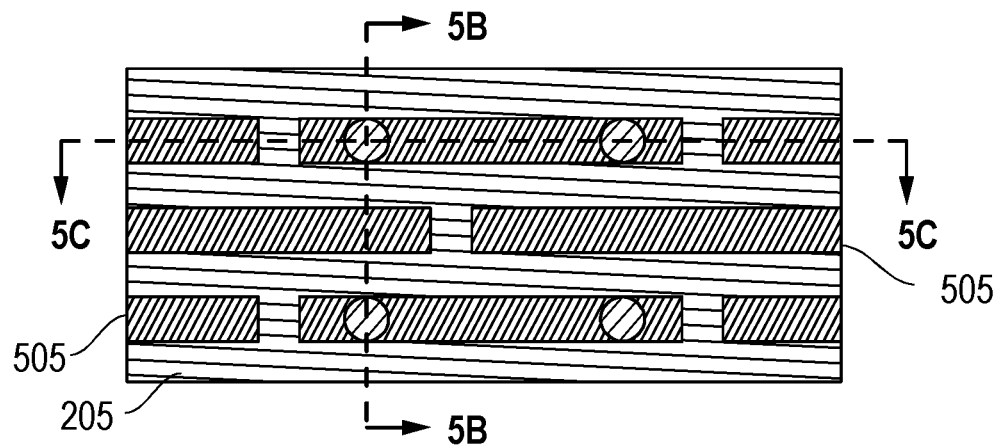
Figure 5B:
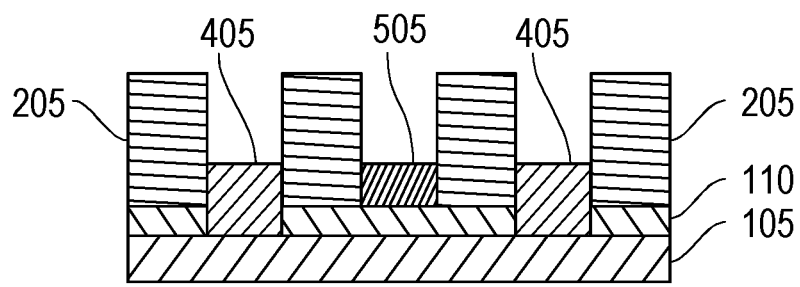
Figure 5C:
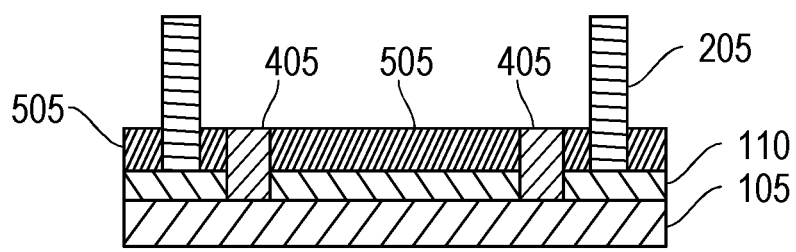
Figure 6A:
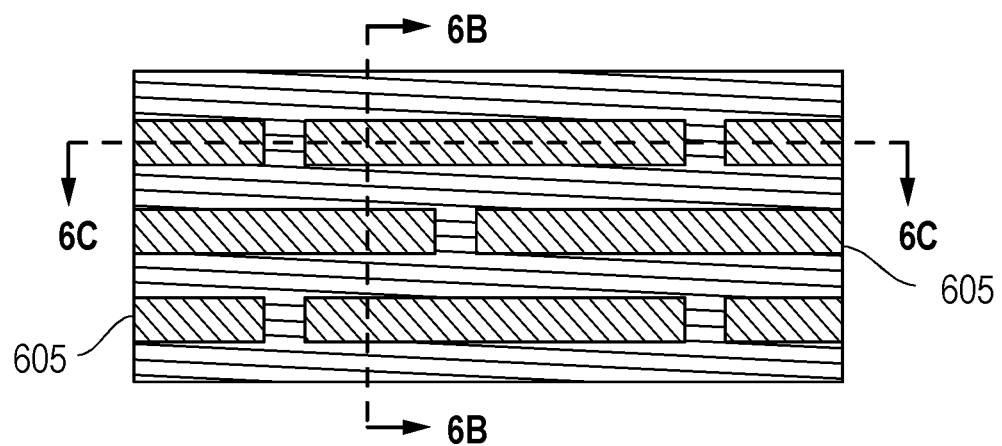
Figure 6B:
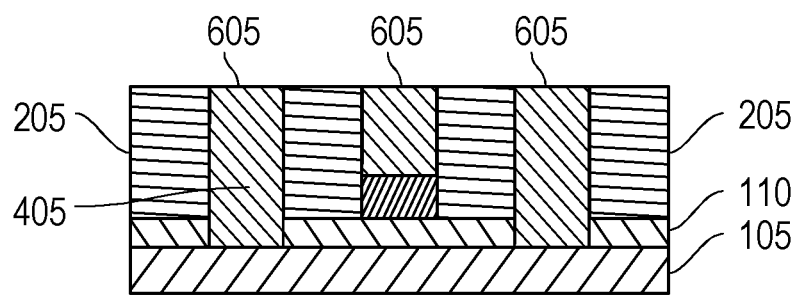
Figure 6C:
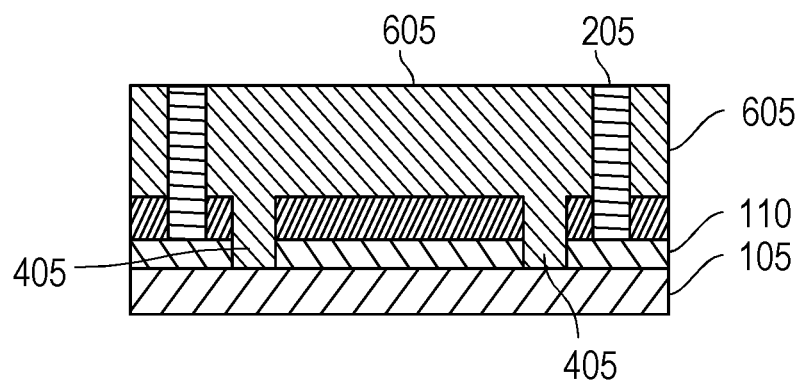
Figure 7A:
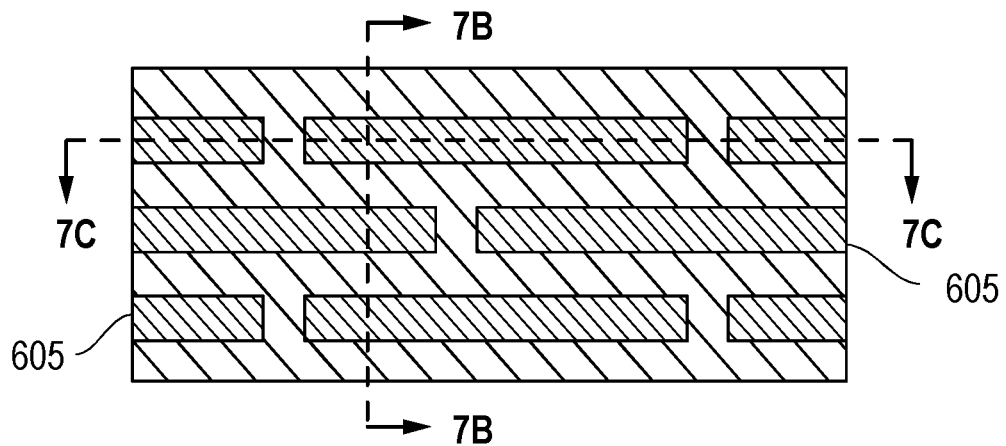
Figure 7B:
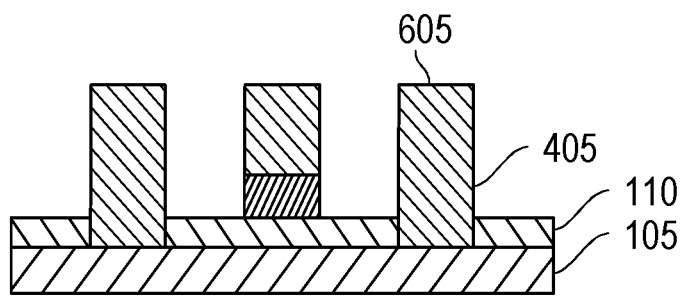
Figure 7C:
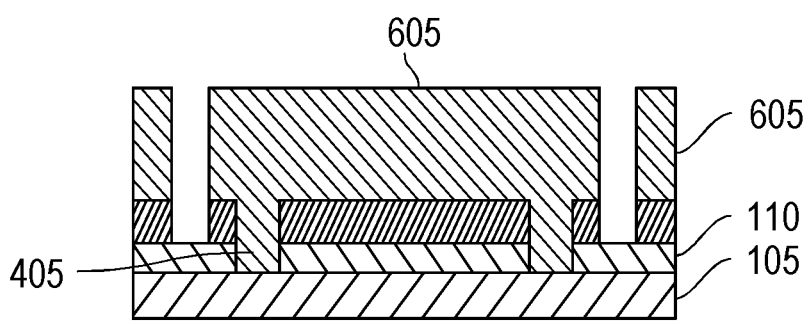
Figure 8A:
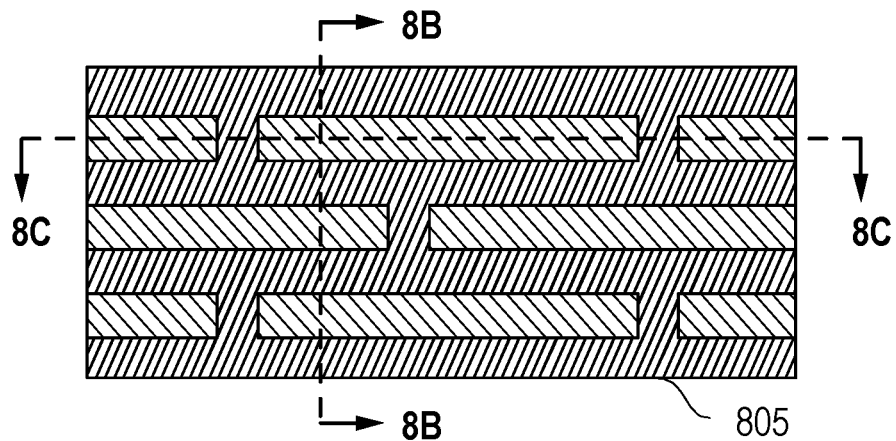
Figure 8B:
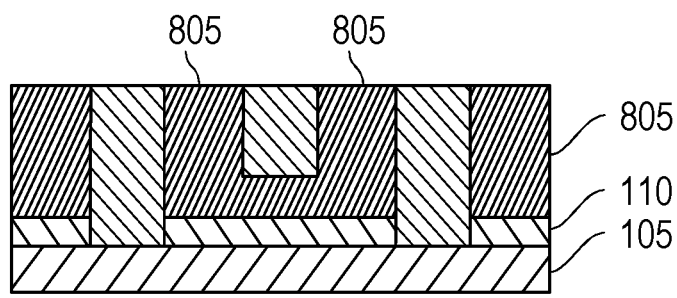
Figure 8C:
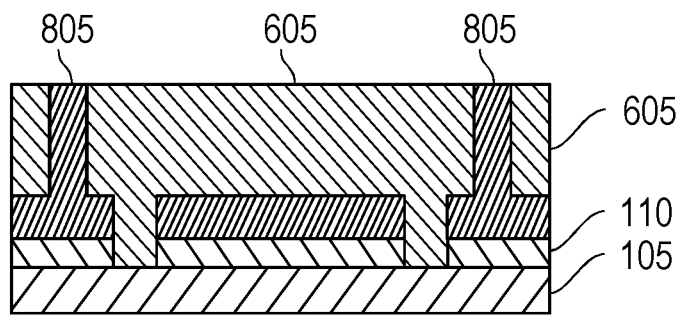

Next, processing proceeds as shown in FIGS. 5A-5C. As shown in FIGS. 5A-5C, an ultra low-k dielectric 505 is formed between the ruthenium conductor pillars 405 and the sacrificial layer 205 as shown. The ultra low-k dielectric may be filled to the height as shown or may be etched back to the desired level. Then as shown in FIGS. 6A-6C, the trench regions (e.g. gaps between the sacrificial layers 205) are filled with ruthenium 605, wherein the ruthenium 605 contacts the ruthenium conductor pillars 405 of the via regions as shown. The ruthenium fill may be to the desired height or may be deposited and etched back or chemically mechanically planarized back to the desired height. As shown FIGS. 7A-7C, the sacrificial layer 205 may then be removed to expose the underlying Blok layer 110. Then, as shown in FIGS. 8A-8C, the regions where the sacrificial layer 205 has been removed may be filled with additional ultra low-k dielectric 805. The additional ultra low-k dielectric 805 may be filled to the appropriate height or etched back/planarized to the desired height.

The process flow shown in FIGS. 2A-8C provides the advantages described above when conductor vias are inversely patterned in the form of pillars that are formed before the final dielectric stack is deposited. For example, the ultra low-k dielectric is not exposed to ruthenium etch chemistry, so damage to the dielectric is prevented. Further, the techniques shown provide an ultra low-k dielectric 805 with a chamfer angle of 90° due to this integration scheme. In addition, the metal conductor can be recessed on the lower level to fully align the via. Also the process flow allows fully aligning by using a standard recess into the level below. Finally, the process allows for the implementation of spin on low-k dielectrics for the layer such as ultra low-k dielectric 805 as the layer merely fills the regions where the sacrificial layer 205 was removed.

FIGS. 9A-16C illustrate in more detail a direct etch embodiment of the concepts described herein. The direct fill embodiments (FIGS. 2A-8C) advantages include, but are not limited to, (1) the ultra low-k dielectric is not exposed to Ru etch chemistry, so damage is not a concern, (2) the chamfer angle of the ultra low-k dielectric may be 90 degrees (or near 90 degrees) due to the this integration scheme, (3) the metal conductor may be recessed to allow for a fully aligned via, (4) a spin on ultra low-k dielectric may be easily used rather than a more expensive deposited ultra low-k dielectric, and (5) the process-can be fully aligned by using a standard recess process into the level below. The direct etch embodiment (FIGS. 9A-16C) advantages include, but are not limited to, (1) the ultra low-k dielectric is not exposed to Ru etch chemistry, so damage is not a concern, (2) the chamfer angle of the ultra low-k dielectric may be 90 degrees (or near 90 degrees) due to the this integration scheme, (3) can recess the metal on the lower level allow for a fully aligned via, (4) a spin on ultra low-k dielectric may be easily used rather than a more expensive deposited ultra low-k dielectric, and (5) the process does not require a high aspect ratio ruthenium fill. In FIGS. 9A-16C, the process steps are shown in three views of the substrate: a top down view, a first cross-section B-B (the top to bottom cross section of the top down view), and a second cross-section C-C (the left to right cross section of the top down view). Each FIG. 9A, 10A, 11A . . . 16A illustrates the top down view, each FIG. 9B, 10B, 11B . . . 16B illustrates the corresponding cross section B-B, and each FIG. 9C, 10C, 11C . . . 16C illustrates the corresponding cross section C-C.

Figure 9A:
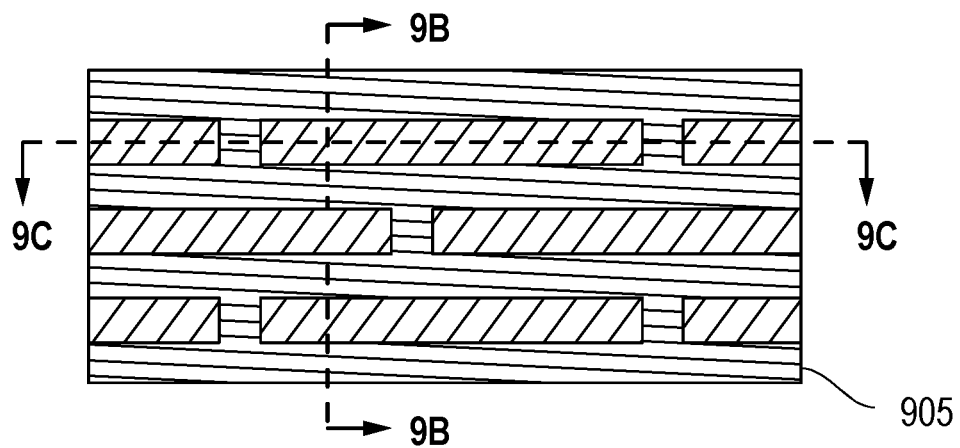
FIGS. 9A-16C illustrate a direct etch embodiment of an exemplary damascene process according to techniques disclosed herein.
Figure 9B:
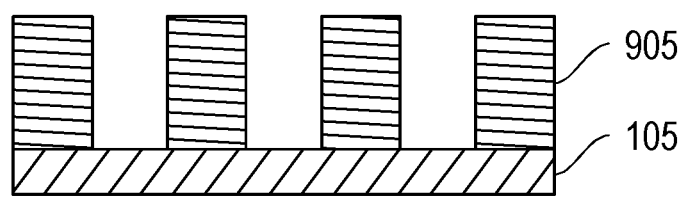
Figure 9C:
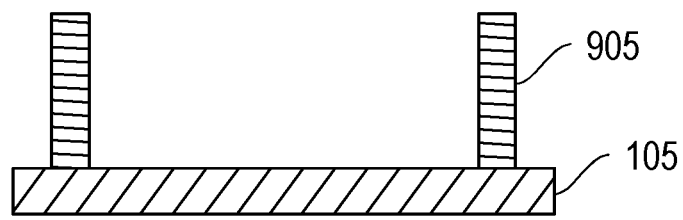

As shown in FIG. 9A-9C, the substrate is substantially similar to that as described above with regard to FIG. 2A-2C in that a sacrificial layer 905 is provided, except in FIGS. 9A-9C, a Blok layer is not utilized above the underlying conductor layer 105.

Figure 10A:
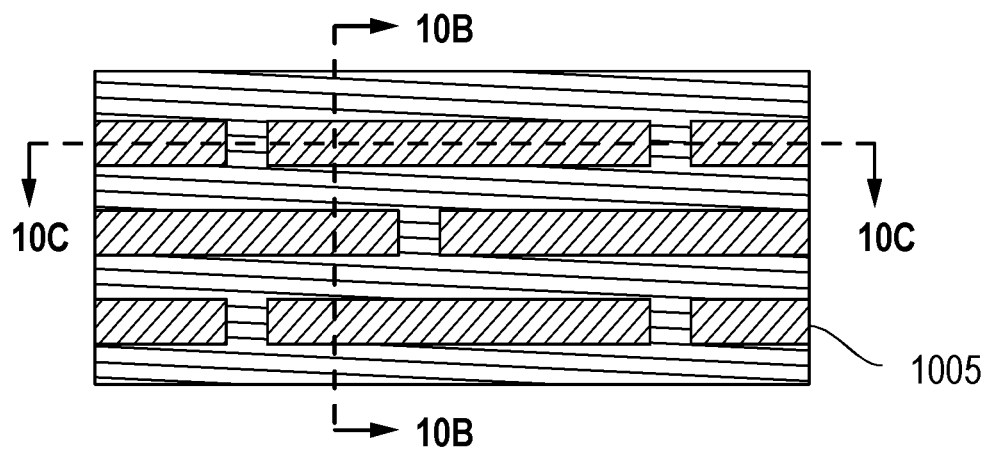
Figure 10B:
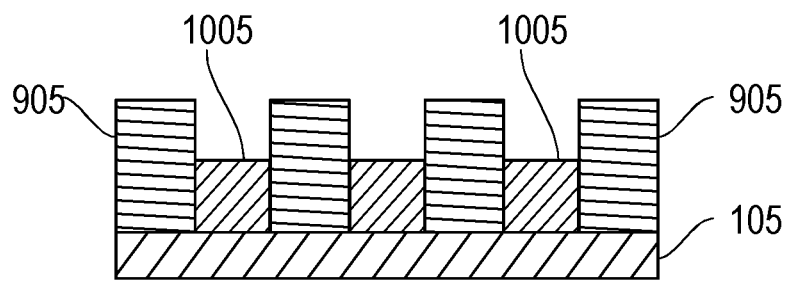
Figure 10C:
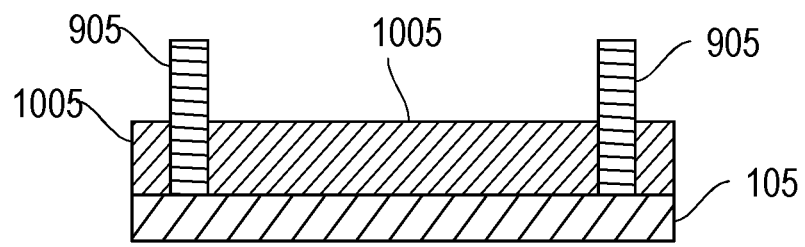
Figure 11A:
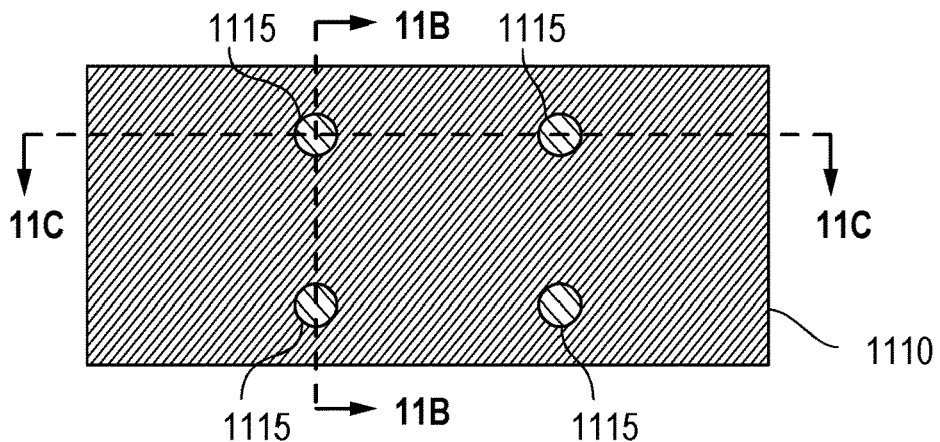
Figure 11B:
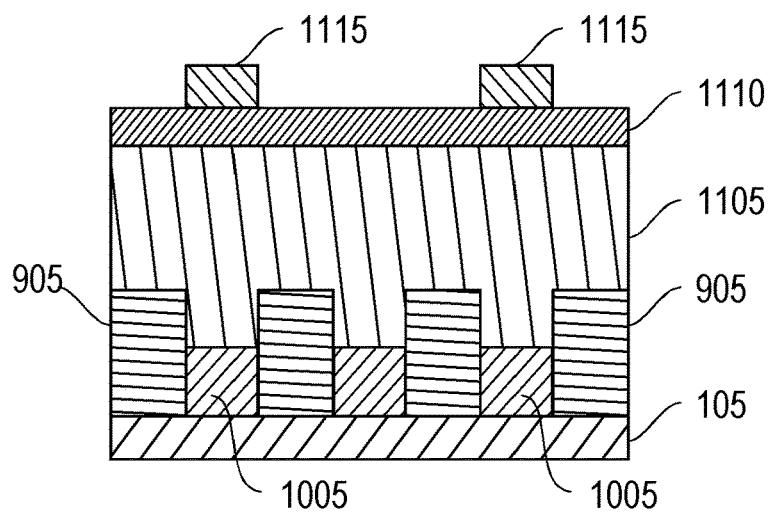
Figure 11C:
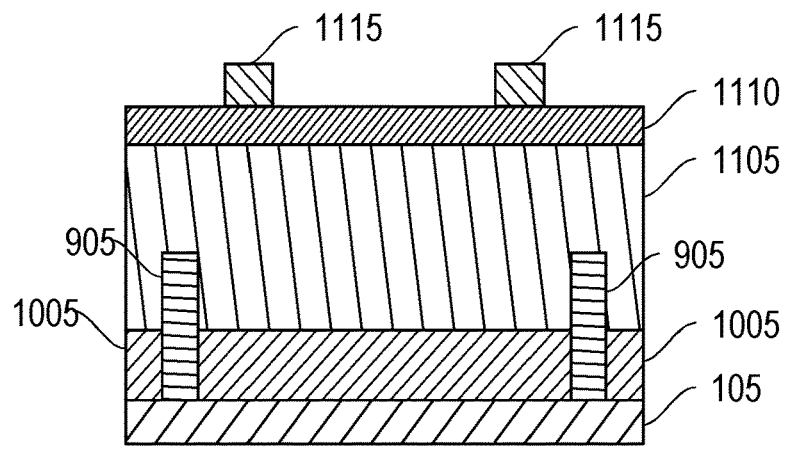

As shown in FIGS. 10A-10C, a partial fill of a ruthenium layer 1005 is performed between the portions of the sacrificial layer 905. Next, as shown in FIGS. 11A-11C, an organic planarization layer 1105 and an antireflective coating 1110 may be provided over the substrate. Exemplary coatings include, but are not limited to, silicon antireflective coatings or silicon oxynitride antireflective coatings. Further, a photo resist pattern 1115 corresponding to an inverse tone of the via pillars is provided as also shown in FIGS. 11A-11C.

Figure 12A:
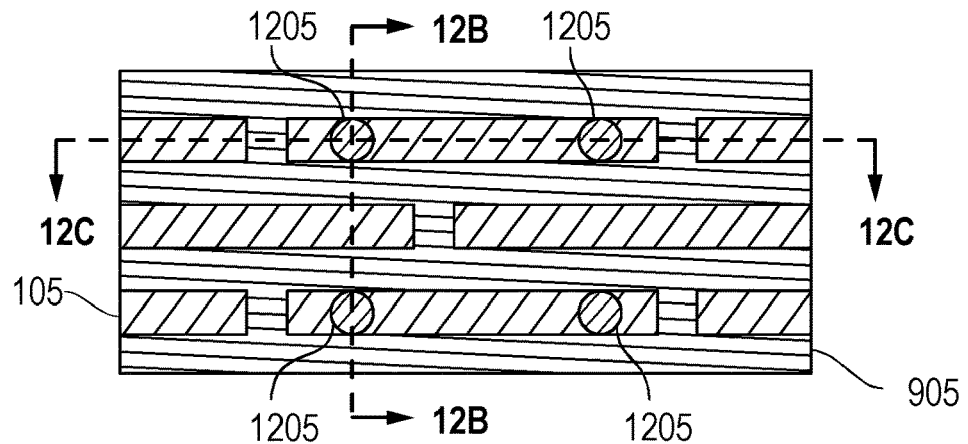
Figure 12B:
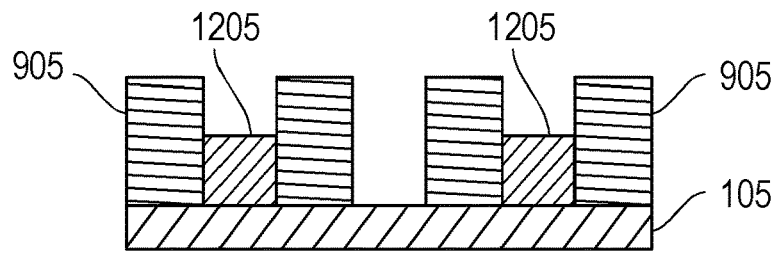
Figure 12C:
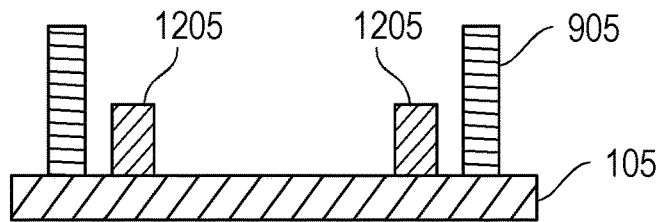
Figure 13A:
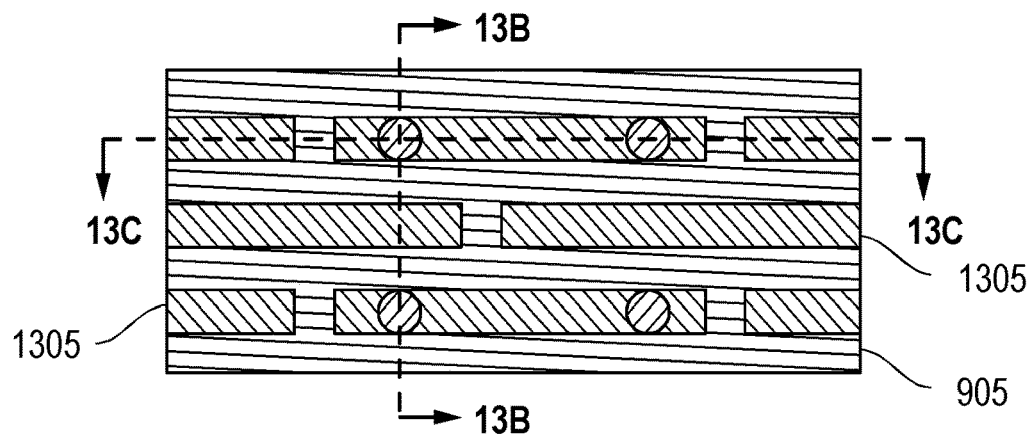
Figure 13B:
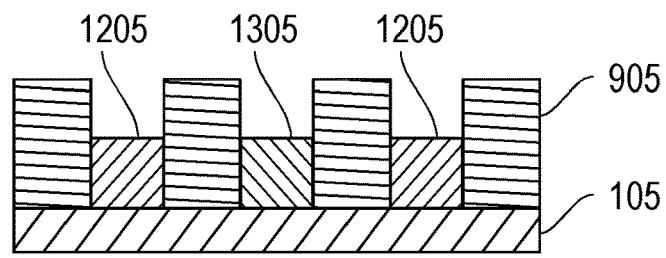
Figure 13C:
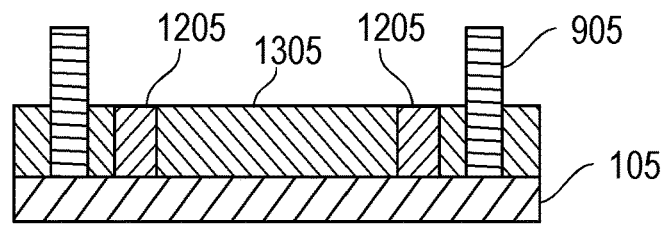
Figure 14A:
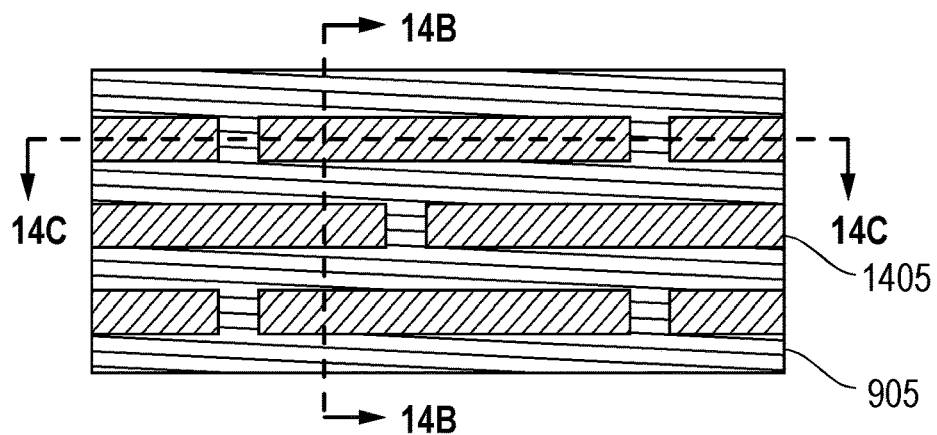
Figure 14B:
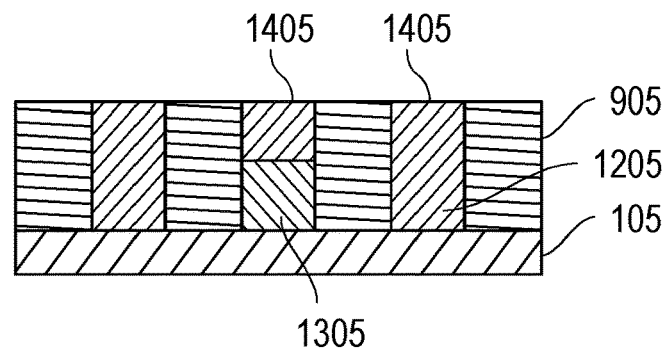
Figure 14C:
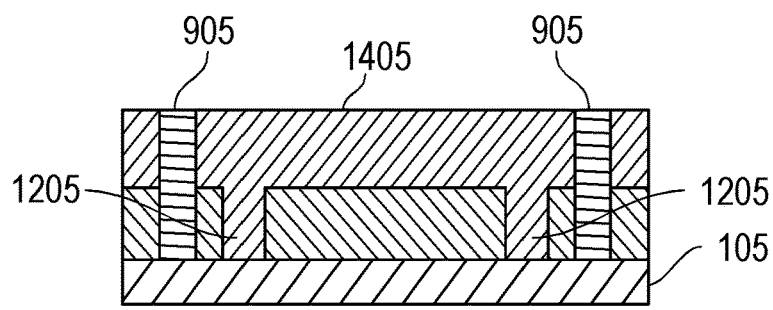

Next as shown in FIGS. 12A-12C, the photo resist pattern 115 is used to etch the unprotected portions of the antireflective coating 1110, the organic planarization layer 1105, and the ruthenium layer 1005. Then the photo resist, antireflective coating and the organic planarization layer all removed. Thus, as shown in FIGS. 12B and 12C, ruthenium conductor pillars 1205 and sacrificial layer 905 remain on the substrate. As shown in FIGS. 13A-13C, an ultra low-k dielectric layer 1305 fill may be performed (either a partial selective fill or a fill and etch back). Thus, the ultra low-k dielectric layer 1305 is provided between the ruthenium conductor pillars 1205 and sacrificial layer 905 as shown. Then as shown in FIGS. 14A-14C, an additional ruthenium layer 1405 is formed filling the trench regions and contacting ruthenium conductor pillars 1205 of the via regions. The fill may be to the desired height or may be etched back or chemically mechanically planarized back to the desired height.

Figure 15A:
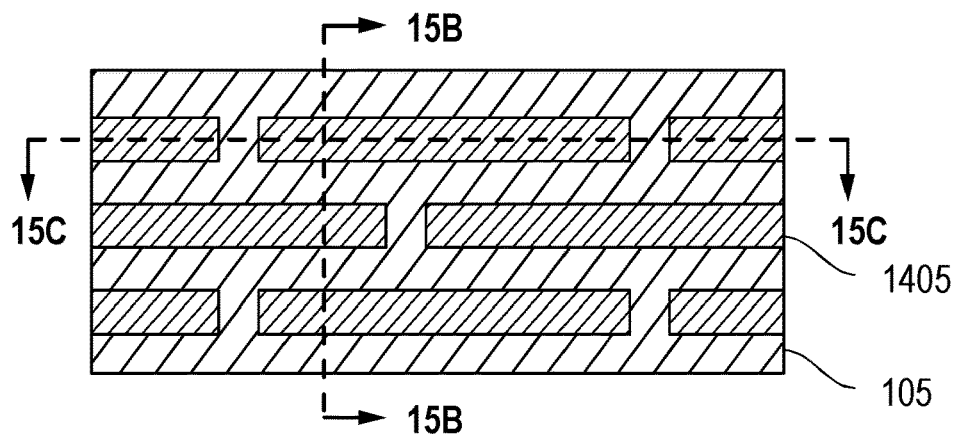
Figure 15B:
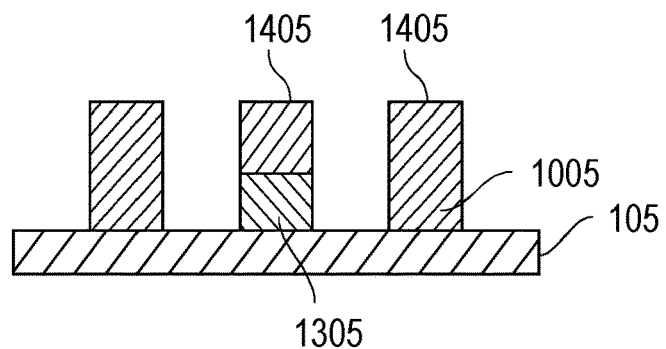
Figure 15C:
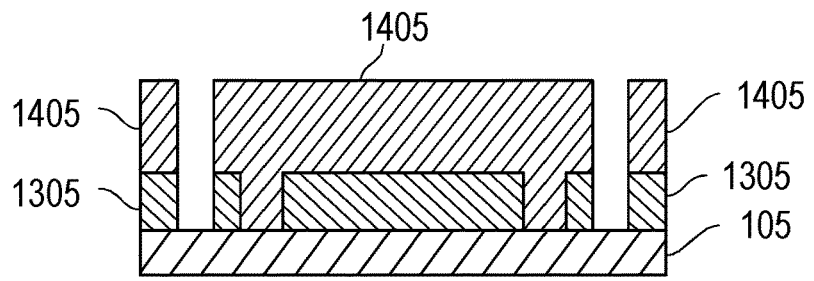
Figure 16A:
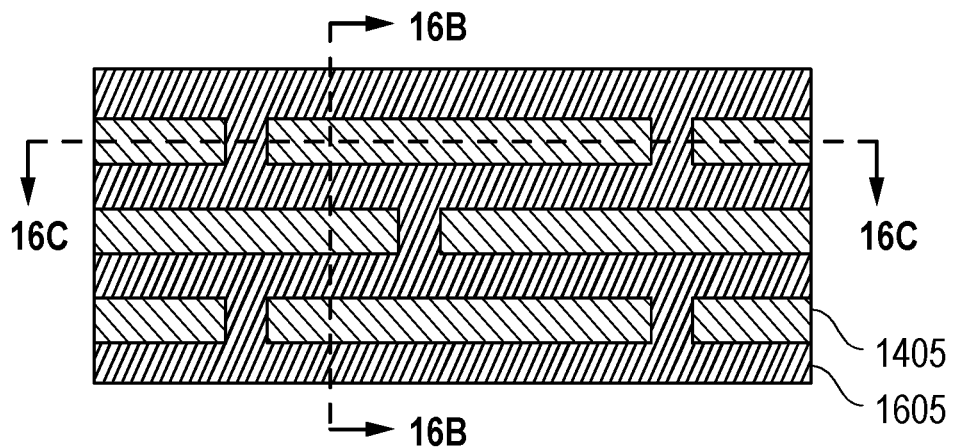
Figure 16B:
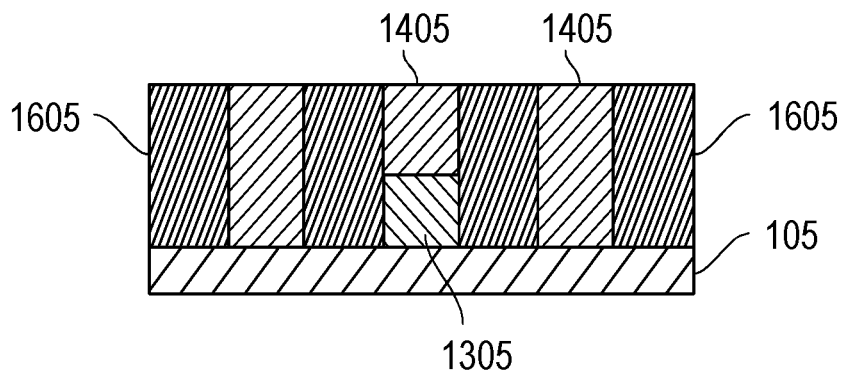
Figure 16C:
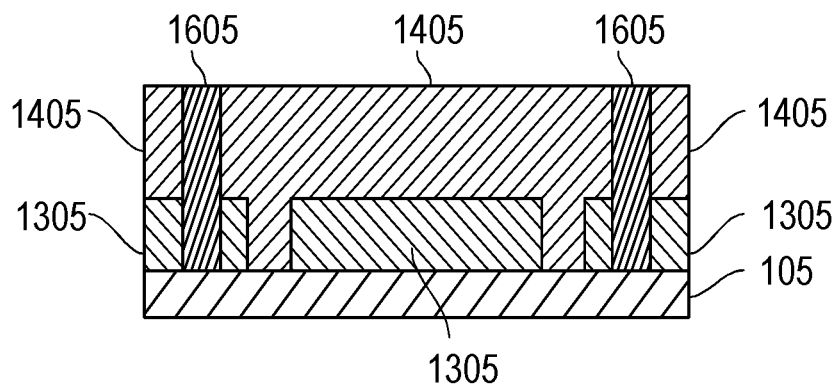

Then, as shown in FIG. 15A-15C, the sacrificial layer 905 may be removed. Then, as shown in FIGS. 16A-16C, the regions where the sacrificial layer 905 has been removed may be filled with an additional ultra low-k dielectric layer 1605. The additional ultra low-k dielectric layer 1605 may be filled to the appropriate height or etched back/planarized to the desired height.

The process flow shown in FIGS. 9A-16C provides the advantages described above when conductor vias are inversely patterned in the form of pillars that are formed before the final dielectric stack is deposited. For example, the ultra low-k dielectric is not exposed to ruthenium etch chemistry, so damage to the dielectric is prevented. Further, the techniques shown provide a dielectric with a chamfer angle of 90° due to this integration scheme. In addition, the metal conductor can be recessed on the lower level to fully align the via. Also the process flow allows fully aligning by using a standard recess into the level below. The process also allows for the implementation of spin on low-k dielectrics. Further, it is noted that the process does not require a high aspect ratio via fill.

Figure 17:
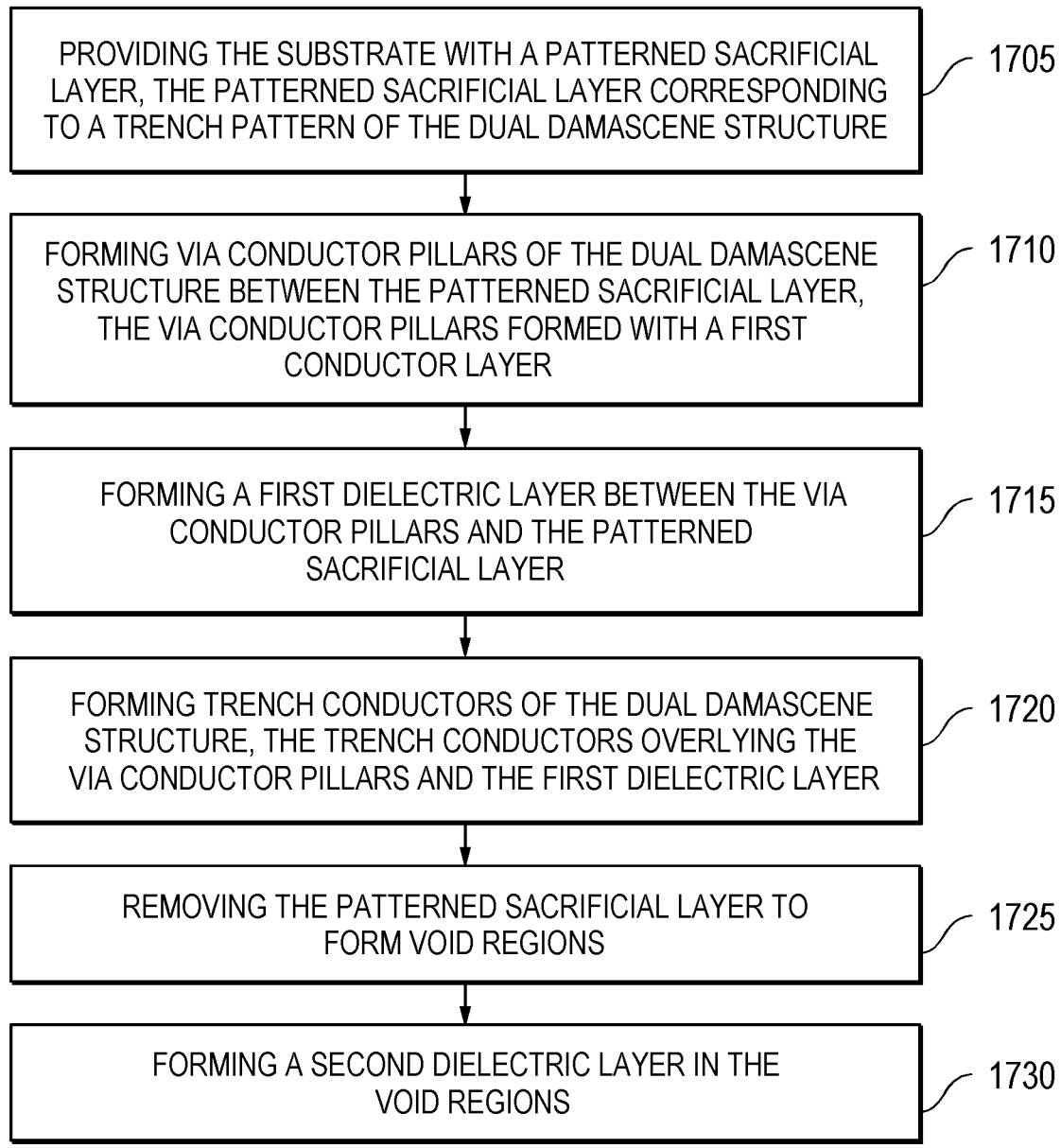
FIG. 17 illustrates a flow chart for a method embodiment of an exemplary damascene process according to techniques disclosed herein.

FIG. 17 illustrates an exemplary method for use of the processing techniques described herein. It will be recognized that the embodiment of FIG. 17 is merely exemplary and additional methods may utilize the techniques described herein. Further, additional processing steps may be added to the method shown in the FIG. 17 as the steps described are not intended to be exclusive. Moreover, the order of the steps is not limited to the order shown in the FIG. 17 as different orders may occur and/or various steps may be performed in combination or at the same time.

FIG. 17 illustrates a method for providing a dual damascene structure on a substrate. The method of FIG. 17 comprises step 1705 of providing the substrate with a patterned sacrificial layer (e.g. sacrificial layer 115, 205 or 905), the patterned sacrificial layer corresponding to a trench pattern of the dual damascene structure. The method further includes step 1710 of forming via conductor pillars (e.g. ruthenium pillars 120, 405, or 1205) of the dual damascene structure between the patterned sacrificial layer, the via conductor pillars formed with a first conductor layer. The method also includes step 1715 of forming a first dielectric layer (e.g. ultra low-k dielectric layer 125, 505, or 1305) between the via conductor pillars and the patterned sacrificial layer. The method further comprises step 1720 of forming trench conductors (e.g. ruthenium layer 130, 605, or 1405) of the dual damascene structure, the trench conductors overlying the via conductor pillars and the first dielectric layer. The method still further comprises step 1725 of removing the patterned sacrificial layer to form void regions and step 1730 of forming a second dielectric layer (e.g. additional ultra low-k dielectric 135, 805, or 1605) in the void regions.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for providing a dual damascene structure on a substrate, comprising:
    providing the substrate with a patterned sacrificial layer on an underlying layer, the patterned sacrificial layer corresponding to a trench pattern for the dual damascene structure;
    forming via conductor pillars for the dual damascene structure between the patterned sacrificial layer, the via conductor pillars formed with a first conductor layer;
    forming a first dielectric layer between the via conductor pillars and the patterned sacrificial layer such that the first dielectric layer abuts at least a part of a surface of the via conductor pillars and abuts at least a part of the underlying layer, the surface being between the via conductor pillars and the patterned sacrificial layer;
    forming trench conductors for the dual damascene structure, the trench conductors overlying the via conductor pillars and the first dielectric layer;
    removing the patterned sacrificial layer to form void regions; and
    forming a second dielectric layer in the void regions.

2. The method of claim 1, wherein the via conductor pillars and the trench conductors comprise ruthenium.

3. The method of claim 2, wherein the first dielectric layer and the second dielectric layer both comprise a low-k dielectric.

4. The method of claim 1, wherein the first dielectric layer and the second dielectric layer both comprise a low-k dielectric.

5. The method of claim 1, wherein the first dielectric layer is formed to a height, measured with respect to a surface of the substrate with respect to the substrate, that is less than a height, measured with respect to the surface of the substrate with respect to the substrate of the patterned sacrificial layer.

6. The method of claim 1, wherein the patterned sacrificial layer comprises a dielectric material.

7. The method of claim 1, wherein the forming via conductor pillars comprises:
    patterning via regions on the substrate; and
    forming the first conductor layer in the via regions to provide the via conductor pillars.

8. The method of claim 7, wherein the underlying layer is a third dielectric layer overlying an underlying conductor layer.

9. The method of claim 8, wherein the third dielectric layer is a barrier low-k layer.

10. The method of claim 9, wherein the barrier low-k layer is between the underlying conductor layer and the patterned sacrificial layer.

11. The method of claim 9, wherein the barrier low-k layer is between the first dielectric layer and the underlying conductor layer.

12. The method of claim 8, wherein the third dielectric layer is a barrier layer and the patterning of via regions includes removing at least a portion of the barrier layer.

13. The method of claim 12, wherein the via conductor pillars contact the underlying conductor layer by the via conductor pillars extending through the barrier layer where the at least portions of the barrier layer are removed.

14. The method of claim 7, wherein the via conductor pillars are formed to a height, measured with respect to a surface of the substrate with respect to the substrate less than a height, measured with respect to the surface of the substrate with respect to the substrate, of the patterned sacrificial layer.

15. The method of claim 1, wherein the forming via conductor pillars comprises:
    forming the first conductor layer between structures of the patterned sacrificial layer; and
    after forming the first conductor layer, patterning the first conductor layer in accordance with a via pattern of the dual damascene structure to provide the via conductor pillars.

16. The method of claim 15, wherein at least portions of the first conductor layer contact an underlying conductor layer before the patterning of the first conductor layer.

17. The method of claim 16, wherein the patterned sacrificial layer contacts the underlying conductor layer.

18. The method of claim 15, further comprising forming a planarization layer over the first conductor layer and over the patterned sacrificial layer prior to patterning the first conductor layer.

19. The method of claim 15, wherein patterning the first conductor layer exposes at least portions of an underlying conductor layer, the underlying conductor layer being under at least portions of the first conductor layer.

20. The method of claim 19, wherein the first conductor layer comprising ruthenium.

\* \* \* \* \*